United States Patent
Oikawa et al.

Patent Number: 5,723,259
Date of Patent: Mar. 3, 1998

[54] NEGATIVE TYPE COMPOSITION FOR CHEMICALLY AMPLIFIED RESIST AND PROCESS AND APPARATUS OF FORMATION OF CHEMICALLY AMPLIFIED RESIST PATTERN

[75] Inventors: Akira Oikawa; Hiroyuki Tanaka; Hideyuki Matsuda, all of Kawasaki, Japan

[73] Assignee: Fujitsu Limited, Kawasaki, Japan

[21] Appl. No.: 735,570

[22] Filed: Oct. 23, 1996

Related U.S. Application Data

[60] Continuation of Ser. No. 468,744, Jun. 6, 1995, abandoned, which is a division of Ser. No. 446,517, May 22, 1995, abandoned, which is a continuation of Ser. No. 997,704, Jan. 5, 1993, abandoned.

Foreign Application Priority Data

| Jan. 7, 1992 | [JP] | Japan | 4-000740 |
| Jan. 17, 1992 | [JP] | Japan | 4-006652 |
| Sep. 24, 1992 | [JP] | Japan | 4-254283 |

[51] Int. Cl.$^6$ .................................. G03F 7/16
[52] U.S. Cl. .................. 430/272.1; 430/327; 430/330
[58] Field of Search ...................... 430/272.2, 327

References Cited

U.S. PATENT DOCUMENTS

| 3,520,683 | 7/1970 | Kerwin | 430/327 X |
| 3,942,982 | 3/1976 | Yanazawa et al. | 430/327 X |
| 4,592,926 | 6/1986 | Rubin et al. | 430/272 |
| 4,924,800 | 5/1990 | Tanaka | |
| 5,057,399 | 10/1991 | Flaim et al. | 430/313 |
| 5,094,934 | 3/1992 | Lazarus | 430/309 |
| 5,286,599 | 2/1994 | Babich et al. | 430/270.1 |
| 5,401,614 | 3/1995 | Dichiara et al. | 430/272 X |

FOREIGN PATENT DOCUMENTS

| 0103052 | 3/1984 | European Pat. Off. | 430/327 |
| 0388813 | 9/1990 | European Pat. Off. | |
| 0401499 | 12/1990 | European Pat. Off. | |
| 0407086 A2 | 1/1991 | European Pat. Off. | |
| 57-68834 | 4/1982 | Japan | 430/272 |
| 2-258423 | 10/1989 | Japan | 430/327 |
| 3-75652 | 3/1991 | Japan | |
| 3-107162 | 5/1991 | Japan | |

OTHER PUBLICATIONS

Lamola et. al., "Chemically Amplified Resists", *Solid State Technology* 53–60 (Aug. 1991).

Frechet at al., "Chapter 5: Nonswelling Negative Resists Incorporating Chemical Amplification", pp. 74–75, from *ACS Symposium Series 412: Polymers in Microlithography: Materials and Processes* ed. by Reichmanis et al. ACS, 1989.

*Primary Examiner*—Cynthia Hamilton
*Attorney, Agent, or Firm*—Armstrong, Westerman, Hattori, McLeland & Naughton

[57] ABSTRACT

A composition for negative type chemically amplified resist including, as main components, a random copolymer of vinyl phenol and vinyl cyclohexanol, a melamine resin having an enhanced hexamethoxymethylmelamine content, an acid generator for generating an acid upon irradiation by ionizing radiation, and a solvent. The resist pattern formation process and apparatus are also disclosed.

1 Claim, 4 Drawing Sheets

NEGATIVE TYPE COMPOSITION FOR CHEMICALLY AMPLIFIED RESIST AND PROCESS AND APPARATUS OF FORMATION OF CHEMICALLY AMPLIFIED RESIST PATTERN

This is a continuation of application Ser. No. 08/468,744, filed Jun. 6, 1995, now abandoned which is a division of application Ser. No. 08/446,517, filed May 22, 1995, now abandoned, which is a continuation of application Ser. No. 07/997,704, filed Jan. 5, 1993, now abandoned.

BACKGROUND OF THE INVENTION

1. Field of the Invention

The present invention relates to a composition for a negative type chemically amplified resist, useful for pattern formation of semiconductor devices. The present invention also relate to a process of formation of a negative type chemical amplification resist pattern, useful for the process of pattern formation of semiconductor devices, including the steps of coating on a treated substrate the above-mentioned resist composition, exposing it, heat treating it, and developing it. The present invention can be advantageously used for the production of an LSI, VLSI, and other semiconductor devices and can provide a highly integrated semiconductor device.

The present invention further relates to a resist pattern formation process and resist coating apparatus, and more specifically, it relates to a method of preventing the deterioration of the resist pattern caused by the hydrophobic treatment agent used in the hydrophobic treatment.

2. Description of the Related Art

Along with the increasingly high degree of integration of semiconductor integrated circuits, at the present time, the industry is demanding greater miniaturization of patterns along with the high degree of integration of semiconductor integrated circuits and therefore more severe demands are placed on the performance of the resist materials essential at the time of formation of the patterns.

In recent years, chemical amplification type resists have come into the limelight as materials developed to meet all the requirements of resolution, sensitivity, and dry etching resistance. There are several types of chemical amplification type resists. One example of the negative type is one comprised, as main components, of an alkali-soluble substrate resin, a cross-linking agent, an acid generator, and a solvent. In this type of resist material, usually spin coating is used to form the resist film, the resist film is prebaked, then the pattern is exposed through a recticle, whereupon an acid is produced only at the portions irradiated by the ionizing radiation. When charged particles like those of an electron beam are used as the ionizing radiation, it is usually to scan the resist film without gong through a recticle. By applying heat treatment after the exposure by ionizing radiation, an acid is produced from the acid generator and this acid activates the cross-linking agent, so the substrate resin is made insoluble. Development is then performed so as to form a negative type pattern.

In the above-mentioned chemical amplification type resist, the acid produced from the acid generator works as a catalyst to activate a large amount of the cross-linking agent, so a high sensitivity can be realized and the absorption by the photosensitive agent can be reduced compared with the conventional type of photoresist, so a high resolution is realized. Further, like with the conventional type of resist, it is possible to use a phenolic resin as the substrate resin and therefore there is the advantage that the resistance at the later dry etching step is maintained.

In such a pattern formation process using a chemical amplification type resist, however, when the exposure light source was changed from the conventional g, i-beam to a KrF eximer laser (248 nm), the problem occurred of an effect on the absorption by the substrate resin and cross-linking resin and a reverse taper in the pattern formed. Therefore, even when using a KrF eximer laser as the exposure light source, there is a strong need for a resist composition giving a pattern superior in resolution and pattern shape.

On the other hand, in recent years, a higher degree of integration has been demanded for LSI's. It is demanded that circuit patterns be made finer and that LSI chips be made larger in size. Therefore, higher resolution powers are being sought in pattern exposure apparatuses and the exposure wavelengths gradually becomes shorter. Further, a high resolution power is being sought for resists. In this regard, recently, attention has focused on chemical amplification type resists, which include photo acid generators (PAG) or acid generators and much development has been going on. Usually, first heat treatment (prebaking) is applied to the chemical amplification type resist film formed by the spin coating and pattern exposure is performed through a recticle, whereupon acid occurs only at the portions irradiated by the ionizing radiation. When the ionizing radiation is composed of charged particles like with an electron beam, it usually is not passed through a recticle, but directly scans the resist film. By the second heat treatment after the exposure, in the case of a positive type resist, the acid which is produced dissolves the substrate resin and forms a pattern upon development. At this time, since the acid produced acts as a catalyst to dissolve much of the substrate resin, a high sensitivity can be achieved.

When developing the resist film coated on the substrate, use is made of the method of a hydrophobic treatment of the substrate surface so as to prevent the developing solution from penetrating between the resist film and the substrate and causing peeling of the resist film.

FIG. 5 schematically shows the constitution of a conventional resist coating apparatus. In the Figure, 1 is an indexer module for receiving the treated substrate, 9 is a hydrophobic treatment unit, 4 is a cooling unit, 3 is an oven unit, 7 is a coater unit, and 2 is a conveyance means.

The treated substrate receiving in the indexer unit 1 is conveyed by the conveyance means 2 to the hydrophobic treatment unit 9.

The inside of the hydrophobic treatment unit 9 is exhausted, then a solution or vapor of hexamethyldisilazane (hereinafter referred to as HMDS) or other hydrophobic treatment agent is introduced and the substrate is heated, to perform a hydrophobic treatment. After the treatment, air or nitrogen etc. is used to purge or reduce in pressure the hydrophobic treatment unit 9, whereby the hydrophobic treatment agent remaining in the hydrophobic treatment unit 9 and the impurities produced by the reaction are discharged out of the system. Here, "out of the system" means out of the resist coating apparatus or, in the case where the resist coating apparatus is not closed, out of the clean room.

The hydrophobically treated substrate is conveyed to the coater unit 7 and coated with a resist, then is conveyed to the oven unit 3, where it is subjected to heat treatment, then is conveyed to an exposure apparatus (not shown).

In this pattern formation process, however, due to the effects of the impurities etc. in the process, the area near the surface of the resist becomes insoluble even at regions irradiated by the ionizing radiation. A look at the surface shape of the resist shows that areas near the surface protrude out in an eave-like manner and sometimes the pattern cannot be formed at all. Further, in the three-layer resist method, where the pattern is formed on a top resist film formed over an intermediate layer comprised of a silicon-containing resin such as SOG (spin on glass), when a negative type resist is used, the pattern tapers under the top resist pattern and it is not possible to obtain the desired shape of the top resist pattern in some cases. Further, in the case of use of a positive resist, the problem occurs of a pattern with trailing edges. As one of the major factors behind these problems, mention may be made of the contamination caused by HMDS and other hydrophobic treatment agents. That is, it is believed that the acid generated when the chemical amplification type resist is exposed is neutralized by the ammonia produced by the decomposition of the remaining hydrophobic treatment agent and the action of dissolving the substrate resin is reduced.

Therefore, the closed characteristic of the hydrophobic treatment unit is extremely important, but even if the degree of closure is extremely high, if the hydrophobic treated substrate is sent to the next step as it is, the hydrophobic treatment agent and reaction products of the same adhering to the treated substrate are carried out of the hydrophobic treatment unit and discharged in the resist coating apparatus or in the clean room so can becomes sources of contamination. Therefore, as a means for removing from the substrate the hydrophobic treatment agent and reaction products adhering to the treated substrate, the method of additionally heating the treated substrate has been considered, but with this method, while there is an effect on the heated substrate, the hydrophobic treatment agent and reaction products adhering to the substrate are discharged from the substrate to the resist coating apparatus or the clean room, so this does not lead to elimination of the source of contamination and is not a fundamental solution.

SUMMARY OF THE INVENTION

Accordingly, the objects of the present invention are to eliminate the above-mentioned disadvantageous of the prior art and to provide a negative type chemical amplification resist competition which can prevent the deterioration of the shape of the resist pattern, is superior in resolution, and can be effectively used for the production of a highly integrated semiconductor device.

Another object of the present invention is to provide a process for formation of a chemical amplification resist pattern which can form a resist pattern superior in resolution without producing whisker-like residue in the pattern.

A further object of the present invention is to provide a resist pattern formation process which prevents contamination caused by the hydrophobic treatment agent and enables the formation of a stable resist pattern and a resist coating pretreatment apparatus and resist coating apparatus including that resist coating pretreatment apparatus used for the same.

Other objects and advantages of the present invention will be apparent from the following description.

In accordance with the present invention, there is provided a resist composition comprising, as main components, a random copolymer of vinyl phenol and vinyl cyclohexanol, a melamine resin having an enhanced hexamethoxy-methylmelamine content, an acid generator for producing an acid upon irradiation by ionizing radiation, and a solvent. This enables production of a highly integrated semiconductor device.

In accordance with the present invention, there is also provided a process of formation of a chemically amplified resist comprising, successively, a step of coating on a treated substrate the above-mentioned resist composition, an exposure step, a heat treatment step, and a development step, said pattern formation process wherein, in the development step, use is made of a 0.1 to 0.25N aqueous basic solution.

In accordance with the present invention, there is further provided a resist pattern formation process including a step of continuously applying a hydrophobic treatment and heat treatment to a treated substrate using a hydrophobic treatment agent including a basic substance and coating a chemical amplification type resist on said heat treated substrate, in which resist pattern formation process said hydrophobic treatment step and at least one of said heat treatment steps after said hydrophobic treatment step are performed in an atmosphere closed off from the other steps.

In accordance with the present invention, there is still further provided a resist coating pretreatment apparatus is realized by a resist coating pretreatment apparatus comprising a closed container (15) having a purge gas feed port (16), an exhaust port (17), and a treated substrate in- and out-conveyance shutter (18), a conveyance means (14) provided in said closed container (15) and for conveying said treated substrate into said closed container (15) and out of said closed container (15), a hydrophobic treatment unit (9) which has a hydrophobic treatment agent feed port (10), a purge gas feed port (11), and an exhaust port (12) and which applies a hydrophobic treatment to said treated substrate conveyed by said conveyance means (14), and an oven unit (13) which heats said treated substrate subjected to the hydrophobic treatment in said hydrophobic treatment unit (9).

Note that the above-mentioned hydrophobic treatment unit (9) is preferably of a closed construction.

In accordance with the present invention, there is still further provided a resist coating apparatus is realized by a resist coating apparatus having said resist coating pretreatment apparatus (8), a conveyance means (2) which conveys the treated substrate conveyed out from the resist coating pretreatment apparatus (8), a coater unit (7) which coats a resist on said treated substrate conveyed by said conveyance means (2), and an oven unit (3) which heats the said treated substrate coated with a resist by said coater unit (7).

BRIEF DESCRIPTION OF THE DRAWINGS

The present invention will be better understood from the description set forth below with reference to the accompanying drawing, wherein.

DESCRIPTION OF THE PREFERRED EMBODIMENTS

Figure 1:
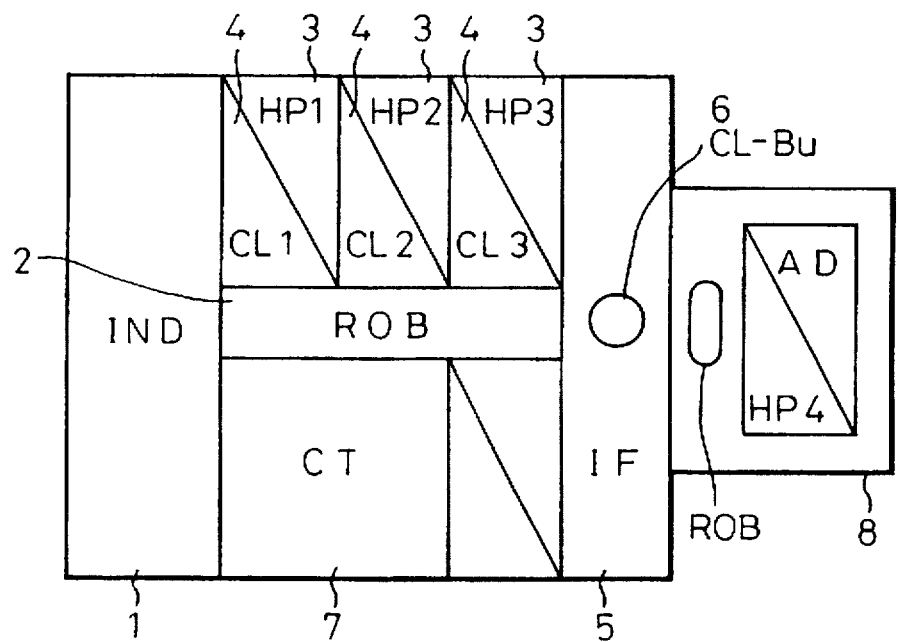
FIG. 1 is a schematic drawing of the constitution of a resist coating apparatus.

In the present invention, the ionizing radiation means visible light, ultraviolet light, X-rays, or other electromagnetic waves and electron beams, ion beams, or other particle beams. The above-mentioned object of the present invention relates to the problems at the time of exposure by a KrF eximer laser of a wavelength of 248 nm, considered a problem in the past, but as mentioned later, the resist composition of the present invention is also effective for pattern formation by exposure by X-rays, electron beams, and other ionizing radiation. Further, in the present invention, an "acid generator" includes not only compounds which generates acid upon irradiation by ionizing radiation, but also compounds which promote the production of an acid by irradiation by ionizing radiation.

The random copolymer of vinyl phenol and vinyl cyclohexanol usable in the present invention typically includes hydrogenated phenol resins which may be an alkali soluble phenol resin, for example, novolak, polyvinylphenol (hereinafter referred to as PVP), and other homopolymers, copolymers of novolak, polyvinylphenol, etc. with other polymers, or other polymers having phenolic hydroxy groups reduced by hydrogen and with part of the benzene groups made cyclohexene rings, but hydrogenated polyvinylphenol is particularly preferred since its transmittance at 248 nm is extremely high. The rate of hydrogenation may be any in the range where the polymer can be dissolved in an alkaline aqueous solution, but it is preferable that the ratio of the reduced benzene rings be less than 30% of the total. If the reduction rate exceeds 30%, the dissolution is too low for the alkali developing solutions convenient for semiconductor production steps, such as 2.38% by weight TMAH aqueous solutions. The above-mentioned hydrogenation rate is more preferably 5 to 25% by weight with respect to the phenol resin. As one example, with a hydrogenated polyvinylphenol with a hydrogenation rate of 20% and a weight average molecular weight of 5,400, the transmittance is 72.7% with a film-shaped sample of 0.7 μm.

In the resist composition of the present invention, use is made of a melamine resin as the cross-linking agent. In the present invention, the melamine resin component is extremely important. Melamine resins are produced industrially and are easy to obtain, so are very advantageous industrially. The commercially available melamine resins, however, include large amounts of dimers and trimers in addition to the hexamethoxymethylmelamine monomers. In general, the content of the hexamethoxymethylmelamine monomers is less than 80% by weight. The melamine resin used in the present invention must be one enhanced in the hexamethoxymethylmelamine monomer content by refining the industrially produced and supplied melamine resin. That is, the hexamethoxymethylmelamine monomer content is preferably at least 85% by weight, more preferably at least 90% by weight, even more preferably at least 95% by weight. If the content of the monomer is less than 80% by weight, the transmittance drops and the pattern formed tends to have a reverse taper shape, so this is not preferable. Further, there is the advantage that, along with an increase in the ratio of the monomer, the resist sensitivity is improved. Note that the method of refinement of the melamine resin which is used in the present invention is not particularly limited.

The resist composition of the present invention is characterized by the simultaneous use of the above-mentioned hydrogenated phenol resin and melamine resin with an enhanced hexamethoxymethylmelamine monomer. By this, a sufficient transmittance is obtained and the pattern shape is improved. These are insufficient with just the effects of the individual components. The rate of mixture of the melamine resin with the enhanced hexamethoxymethylmelamine content is not particularly limited, but preferably it is 2 to 30 parts by weight per 100 parts by weight of the hydrogenated phenol resin, more preferably 5 to 20 parts by weight. If the amount of the melamine resin mixed in is too small, the degree of cross-linking is insufficient, while conversely if too large, the absorption by the melamine becomes larger and therefore the overall transmittance drops and it is difficult to obtain the desired effect of improvement.

As the acid generator mixed in the resist composition of the present invention, that is, the compound generating an acid or promoting the generation of an acid under irradiation of ionizing radiation, mention may be made for example of $Ph_2I^+SbF_6^-$, $Ph_3S^+SbF_6^-$, and other -onium salts, $(Ph_2I^+)_2CO_3^{2-}$, $(Ph_3S^+)_2CO_3^{2-}$, and other salts containing carbonate ions, $Ph_2I^+HCO_3^-$, $Ph_3S^+HCO_3^-$, and other salts containing hydrogencarbonate ions, triazine compounds containing chloromethyl groups and other organic halogen compounds, ortho-nitrobenzyl alcohol sulfonic acid esters and other tosylate compounds, etc. Among these, the organic bromine compounds (I)–(VII) shown below are superior in heat stability and storage stability and are particularly preferred.

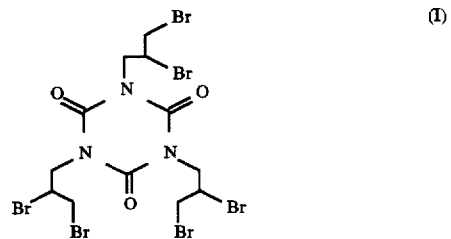

(I)

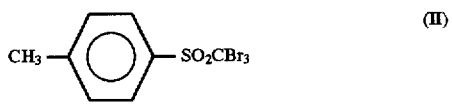

(II)

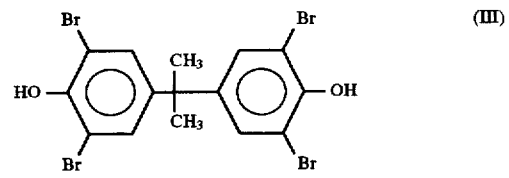

(III)

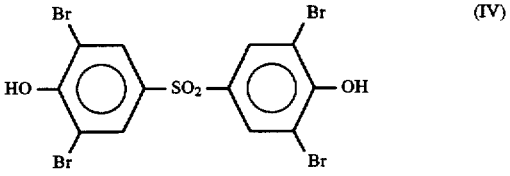

(IV)

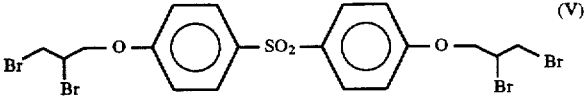

(V)

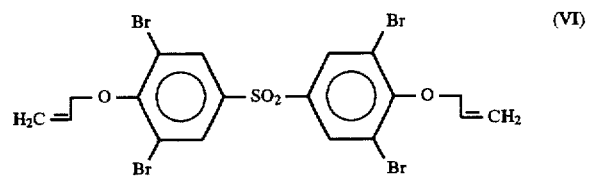

(VI)

-continued

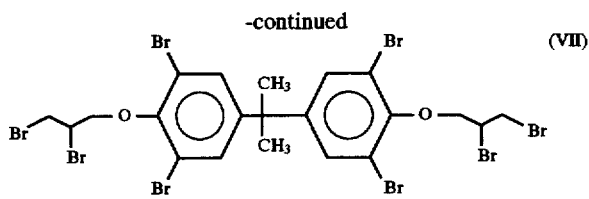

(VII)

The amount of the acid generator mixed in the present invention is not particularly limited, but preferably it is 0.2 to 10 parts by weight per 100 parts by weight of the hydrogenated phenol resin, more preferably 0.5 to 5 parts by weight. If the amount of the acid generator mixed in is too small, the sensitivity drops, while conversely if too large, the film forming performance drops and the pattern ends up with a reverse taper due to the absorption of the acid generator itself.

The solvent mixed in the resist composition of the present invention may be any compound which dissolves the necessary amounts of the other components and is superior in coating property on a substrate. For example, use may be made of alcohols, ketones, ethers, alcohol ethers, esters, cellusolve esters, propylene glycols, diethyl glycols, halogenated hydrocarbons, aromatic hydrocarbons, etc., but use of ethyl lactate or propylene glycol monomethyl ether acetate (PGMEA), which are superior in safety and are high boiling point solvents, is particularly preferable. The amount of the solvent mixed in the present invention is not particularly limited, but in general the solvent is used to give a solids concentration of the resist composition of about 4 to 30% by weight.

According to the first aspect of the present invention, it is possible to form a pattern using the above resist composition. The method of pattern formation consists of the same processing steps as the method of pattern formation using a generally disclosed chemical amplification type resist and includes a step of coating the above-mentioned resist composition on a substrate, a first heat treatment step, a step of irradiating ionizing radiation, a second heat treatment step, and a development step.

In a process of pattern formation using the above-mentioned chemical amplification type resist, if use is made of a 0.27N alkaline aqueous solution (for example, a tetramethylammonium hydroxide (TMAH) aqueous solution), generally used as a developing solution for a conventional g, i-beam resist, as the developing solution, the problem arises that while a fine pattern of a subhalf micron order is resolved, whisker-like residue occurs in the pattern.

The process of pattern formation of a chemical amplification type resist according to the second aspect of the present invention may be based on the same processing steps as the process of formation in the case of use of a generally known chemical amplification type resist. That is, for example, it is possible to form a desired pattern by a step of coating the above-mentioned resist composition on a substrate, a first heat treatment step, a step of irradiating ionizing radiation, a second heat treatment step, and a development step.

The process of formation of a resist pattern according to the present invention is characterized in particular by the development step of the pattern formation process using the above-mentioned resist composition. That is, in the pattern formation process of the present invention, use is made of a basic aqueous solution of a concentration (normality) of 0.1 to 0.25N as the developing solution. If the concentration of the basic aqueous solution is smaller than 0.1N, the resolution falls and there is a tendency for the time required for development to become longer. Conversely, if the concentration is larger than 0.25N, as mentioned above, whisker-like residue easily occurs in the pattern and so practical problems remain. The range of concentration is more preferably 0.15 to 0.20N so as to further enhance the effect. The optimum development time differs depending on the concentration of the developing solution, so it is best to optimize it from the pattern shape formed, but in general it is 30 to 180 seconds.

As the basic aqueous solution used in the present invention, mention may be made of aqueous solutions of sodium hydroxide, potassium hydroxide, sodium silicate, ammonia, and other inorganic alkalis, ethyl amine, propyl amine, and other primary amines, diethyl amine, dipropyl amine, and other secondary amines, trimethyl amine, triethyl amine, and other tertiary amines, diethyl ethanol amine, triethanol amine, and other alcohol amines, tetramethyl ammonium hydroxide, tetraethyl ammonium hydroxide, trimethyl hydroxymethyl ammonium hydroxide, triethyl hydroxymethyl ammonium hydroxide, trimethylhydroxyethyl ammonium hydroxide, and other quaternary ammonium salts, but use of tetramethylammonium hydroxide, tetraethylammonium hydroxide, or trimethylhydroxymethyl ammonium hydroxide is particularly preferred.

According to the first aspect of the present invention, it is possible to produce a semiconductor device using the above-mentioned resist composition. The semiconductor device produced using the resist composition of the present invention can be made integrated more compared with the conventional devices and having a higher performance than conventional semiconductor devices. According to the present invention, as explained in the following examples as well, it is possible to prevent the deterioration of the resist pattern shape and the reduction of the resolution and it is possible to provide a highly integrated semiconductor device. Therefore, this is effective for the production of LSI's, VLSI's, and other semiconductor devices.

According to the second aspect of the present invention, as mentioned above, as explained in detail in the following examples as well, when forming a pattern using a chemical amplification type resist, by using a 0.1 to 0.25N basic aqueous solution as the developing solution in the development step, it is possible to prevent the production of residue and the reduction of the resolution and it is possible to produce a highly integrated semiconductor device. Therefore, the process of formation of a resist pattern according to the present invention is particularly effective for the production of LSI's, VLSI's, and other semiconductor devices.

According to the third aspect of the present invention, the resist coating pretreatment apparatus 8 has a completely closed construction. After the hydrophobic treatment and heat treatment are completed in it, the hydrophobic treatment agent and the reaction products remaining in the resist coating pretreatment apparatus 8 are exhausted to a space closed off from the resist coating apparatus and, further, after purging by nitrogen etc., the treated substrate is conveyed from the resist coating pretreatment apparatus 8, so the other units in the resist coating apparatus are no longer contaminated by the hydrophobic treatment agent or reaction products, it is possible to reduce defects in the case of use of the three-layer resist method such as tapering at the portion under the top negative resist and trailing of the edges at the portion under the top positive resist and eave-like protrusions at the top of the positive resist, and it is possible to produce a semiconductor device with a high degree of integration having a fine pattern.

FIG. 1 schematically shows the constitution of a resist coating apparatus. In FIG. 1, 1 is an indexer module which receives the treated substrate, 2 is a conveyance means, 3 is an oven unit, 4 is a cooling unit, 5 is an interface module having a cooling buffer 6, 7 is a coater unit, and 8 is a resist coating pretreatment apparatus.

Figure 2:
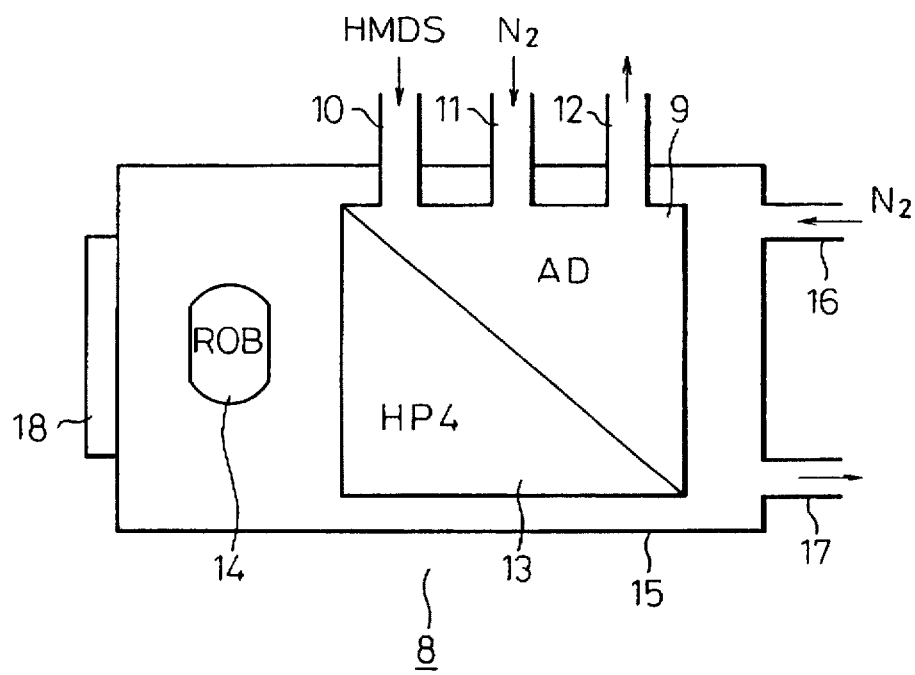
FIG. 2 is a schematic drawing of the constitution of a resist coating pretreatment apparatus.

FIG. 2 shows schematically the detailed constitution of the resist coating pretreatment apparatus 8. In the figure, 9 is a hydrophobic treatment unit, which is provided with a hydrophobic treatment agent feed port 10, a purge gas feed port 11, and an exhaust port 12. Reference numeral 13 is an oven unit which heats the treated substrate which has been hydrophobically treated, and 14 is a conveyance means. Reference numeral 15 is a closed container, which is provided with a nitrogen or other purge gas feed port 16, an exhaust port 17, and a shutter 18 for conveyance of the treated substrate in and out of the unit.

Figure 3A:
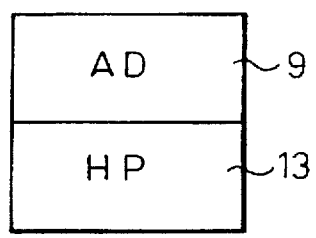
FIG. 3 is a view of the arrangement of a hydrophobic treatment unit and oven unit in a resist coating pretreatment apparatus.
Figure 3B:
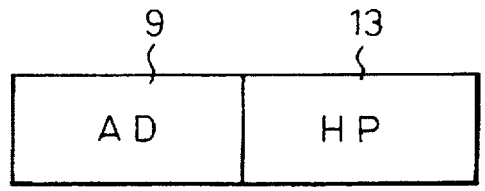

The hydrophobic treatment unit 9 and the oven unit 13 may be arranged above and below each other as shown in FIG. 3(a) or may be arranged right and left as shown in FIG. 3(b).

Figure 4:
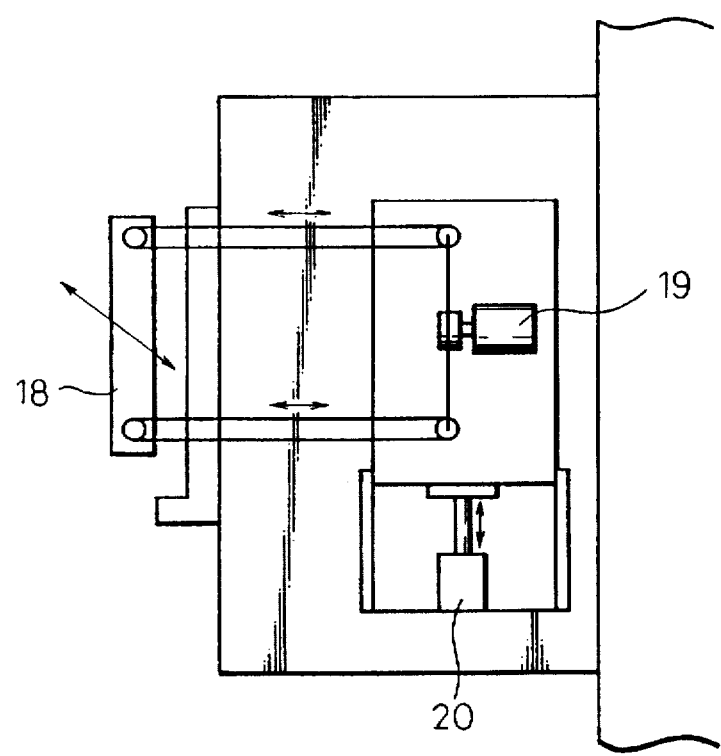
FIG. 4 is a view of a shutter drive mechanism of a resist coating pretreatment apparatus.
Figure 5:
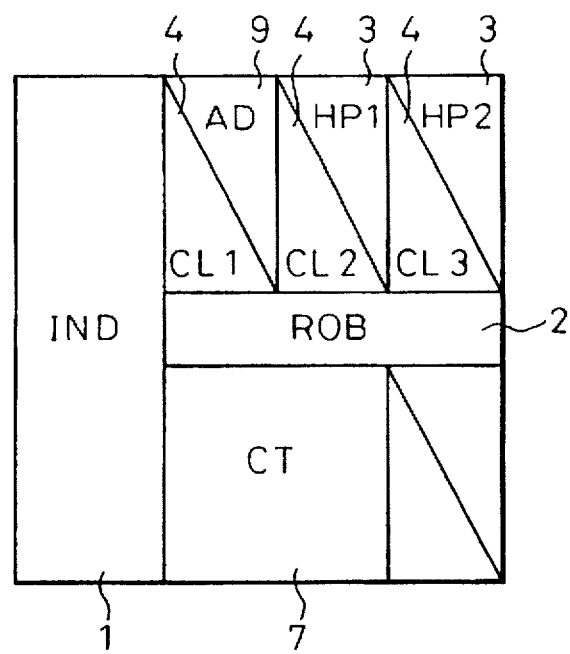
FIG. 5 is a schematic view of the constitution of a conventional coating apparatus.

FIG. 4 is a detailed view of the drive mechanism of the shutter 18 shown in FIG. 2. In the figure, 19 and 20 are drive cylinders. The drive cylinder 19 moves the cylinder 18 in the left and right directions in the figure, while the drive cylinder 20 moves the drive cylinder, which moves the shutter 18 to the left and right directions in the figure, in the upward and downward directions in the figure. As a result, the shutter 18 moves in a slanted direction from the top left to the bottom right in the figure and opens and closes the treated substrate in- and out-conveyance port.

The treated substrate conveyed to the indexer module 1 is conveyed to the interface module 5 using the conveyance means 2. The shutter 18 of the resist coating pretreatment apparatus 8 is opened and the conveyance means 14 is used to convey the treated substrate to the hydrophobic treatment unit 9. Next, the shutter 18 is closed and the inside is exhausted from the exhaust port 12, then the hydrophobic treatment agent is fed in from the hydrophobic treatment agent feed port 10 and the treated substrate is heated to 100° C. Various silylation agents are used as the hydrophobic treatment agent. More specifically, there are trimethylchlorosilane, triethylchlorosilane, and other chlorosilanes, hexamethyldisilazanes, hexamethyldichlorotrisilazane, and other silazanes, trimethylmethoxysilane, trimethylethoxysilanes, and other alkoxysilanes, etc. Among these, hexamethyldisilazane and other silazanes are preferred since they are materials generally used for the surface treatment of various semiconductor substrates.

The vapor of the hydrophobic treatment agent is filled in the hydrophobic treatment unit 9 and allowed to remain there in that state for about 60 seconds for the hydrophobic treatment, then the inside is exhausted from the exhaust port 12 and, further, nitrogen gas is fed in from the purge gas feed port 11 to perform purging for about 30 seconds.

Next, the treated substrate is conveyed from the hydrophobic treatment unit 9 to the oven unit 13 for heat treatment. The temperature of the heat treatment may be any over room temperature to be effective, but one of from 200° C. to 300° C. is preferred. When less than 200° C., the removal of the excess hydrophobic treatment agent and the reaction products is not complete and, further, when over 300° C., the novolak type bottom resist generally used in the three-layer resist method deteriorates, so this is not preferable. The method of heat treatment may be any one, but a hot plate is convenient in the semiconductor production process. More preferably, it is preferable to heat under reduced pressure in the sense of enhancing the removal effect.

After about 90 seconds of heat treatment, the gas was exhausted from the exhaust port 17 of the resist coating pretreatment apparatus 8 and, further, nitrogen was sent in from the purge gas feed port 16 to purge the inside for about 60 seconds. After the purging, the shutter 18 was opened and the conveyance means 14 was used to convey the treated substrate on the cooling buffer 6 and cool it, then the conveyance means 2 was used to convey it to the cooling unit 4 and cool it to ordinary temperature. After the cooling, the substrate was conveyed to the coater unit 7 where the chemical amplification type resist was coated, then it was prebaked at the oven unit 3. The prebaked treated substrate was conveyed to the next step through the indexer module 2.

Note that it is possible to use the resist coating pretreatment apparatus 8 shown in FIG. 2 as an independent apparatus and, further, it is possible to use the resist coating pretreatment apparatus, the exposure apparatus, the development apparatus, etc. as a combined apparatus.

The ammonia concentration near the interface module 5 after treatment of 250 treated substrates by the above-mentioned process was measured, whereupon it was found to be under the detection limit (10 ppb) and it was confirmed that no contamination occurred by the hydrophobic treatment agent. Note that when the heat treatment after the hydrophobic treatment was performed outside of the closed resist coating pretreatment apparatus 8, the ammonia concentration at the same location become about 40 ppb and it was confirmed that there was contamination.

Note that the present invention is not limited to just the case of use of a chemical amplification type resist and is effective also for use of other resists.

As explained above, in the resist pattern formation process and resist coating apparatus according to third aspect of the present invention, the hydrophobic treatment and at least one heat treatment are performed in an atmosphere closed from the other steps, so there is no longer any contamination of the hydrophobically treated substrate by the hydrophobic treatment agent or the reaction product and it becomes possible to form a stable resist pattern.

EXAMPLES

The present invention will now be further illustrated by, but is by no means limited to, the following Examples.

Reference Example 1-1 (Example of Preparation)

One hundred parts by weight of hydrogenated polyvinylphenol resin having a hydrogenation rate of 10% by weight (molecular weight: 5,200), 15 parts by weight of a melamine resin with a hexamethoxymethylmelamine content of 98% by weight, and 2 parts by weight of an acid generator $CH_3$—$C_6H_4$—$SO_2CBr_3$ were added to 490 parts by weight of ethyl lactate and were mixed and dissolved at ordinary temperature to prepare a resist solution.

Reference Example 1-2 (Example of Preparation)

One hundred parts by weight of hydrogenated polyvinylphenol resin having a hydrogenation rate of 20% by weight (molecular weight: 5,400), 15 parts by weight of a melamine resin with a hexamethoxymethylmelamine content of 95% by weight, and 2 parts by weight of an acid generator tris(2,3-dibromopropyl)isocyanulate were added to 490 parts by weight of propylene glycol monomethylether acetate and were mixed and dissolved at ordinary temperature to prepare a resist solution.

Reference Example 1-3 (Example of Preparation)

One hundred parts by weight of hydrogenated polyvinylphenol resin having a hydrogenation rate of 10% by weight (molecular weight: 5,200), 15 parts by weight of a melamine resin with a hexamethoxymethylmelamine content of 95% by weight, and 2 parts by weight of an acid generator having the above-mentioned formula (V) were added to 490 parts by weight of propylene glycol monomethylether acetate and were mixed and dissolved at ordinary temperature to prepare a resist solution.

Example 1-1

The resist solution prepared in Reference Example 1-1 was coated on a silicon substrate by the spin coating method to a thickness of about 0.7 μm, this was prebaked on a hot plate at 90° C. for 90 seconds, then exposure was performed by an eximer laser stepper (NA (numerical aperture): 0.45) of a wavelength of 248 nm. After the exposure, heat treatment was immediately performed on a hot plate at 105° C. for 60 seconds, then puddle development was performed by a 2.38% by weight aqueous TMAH (tetramethylammonium hydroxide) solution for 90 seconds. The obtained pattern had a 1:1 resolution of lines and spaces of 0.35 μm by exposure of 30 mJ/cm$^2$. The pattern shape was substantially perpendicular.

Example 1-2

The resist solution prepared in Reference Example 1-2 was coated on a silicon substrate by the spin coating method to a thickness of about 0.7 μm, this was prebaked on a hot plate at 90° C. for 90 seconds, then exposure was performed by an eximer laser stepper (NA: 0.45) of a wavelength of 248 nm. After the exposure, heat treatment was immediately performed on a hot plate at 120° C. for 60 seconds, then dip development was performed by a 1.50% by weight aqueous TMAH solution for 150 seconds. The obtained pattern had a 1:1 resolution of lines and spaces of 0.30 μm by exposure of 53 mJ/cm$^2$. The pattern shape was substantially perpendicular.

Example 1-3

The resist solution prepared in Reference Example 1-2 was coated on a silicon substrate by the spin coating method to a thickness of about 0.7 μm, this was prebaked on a hot plate at 120° C. for 90 seconds, then exposure was performed by X-rays (SOR). After the exposure, heat treatment was immediately performed on a hot plate at 105° C. for 60 seconds, then dip development was performed by a 1.50% by weight aqueous TMAH solution for 150 seconds. The obtained pattern had a 1:1 resolution of lines and spaces of 0.30 μm, the smallest dimensions of the mask. The pattern shape was substantially perpendicular.

Example 1-4

A resist solution prepared in the same way as Reference Example 1-1 except for using a melamine resin with a hexamethoxymethylmelamine content of 80% by weight in Reference Example 1-1 was used and the same procedure was followed as in Example 1-1 to obtain a pattern. The obtained pattern had a 1:1 resolution of 0.35 μm lines and spaces by exposure of 45 mJ/cm$^2$, but the pattern shape has a reverse taper.

Example 1-5

The resist solution prepared in Reference Example 1-3 was coated on a silicon substrate by the spin coating method to a thickness of about 0.7 μm, this was prebaked on a hot plate at 105° C. for 90 seconds, then exposure was performed by an eximer laser stepper (NA: 0.45) of a wavelength of 248 μm. After the exposure, heat treatment was immediately performed by 1.50% by weight aqueous TMAH solution for 90 seconds. The obtained pattern had a 1:1 resolution of lines and spaces of 0.25 μm by exposure of 36 mJ/cm$^2$. The pattern shape was substantially perpendicular.

As explained above, according to the second aspect of the present invention, by using a resin composition including as main components a hydrogenated phenol resin, a melamine resin with an enhanced hexamethyoxymethylmalamine constant, an acid generator for generating an acid upon irradiation by ionizing radiation, and a solvent, it is possible to obtain a pattern superior in resolution and with an excellent pattern shape.

Reference Example 2-1 (Example of Preparation)

One hundred parts by weight of hydrogenated polyvinylphenol resin of a hydrogenation rate of 10% by weight (molecular weight: 5,200), 15 parts by weight of a melamine resin with a hexamethoxymethylmelamine content of 95% by weight, and 2 parts of weight of an acid generator tris(2,3-dibromopropyl)isocyanulate were added to 490 parts by weight of ethyl lactate and were mixed and dissolved at room temperature to prepare a resist solution.

Reference Example 2-2 (Example of Preparation)

One hundred parts by weight of hydrogenated polyvinylphenol resin of a hydrogenation rate of 20% by weight (molecular weight: 5,400), 15 parts by weight of a melamine resin with a hexamethoxymethylmelamine content of 95% by weight, and 2 parts of weight of an acid generator $CH_3$—$C_6H_4$—$SO_2CBr_3$ were added to 490 parts by weight of propylene glycol monomethyl ether acetate and were mixed and dissolved at room temperature to prepare a resist solution.

Example 2-1

The resist solution prepared in Reference Example 2-1 was coated on a silicon substrate by the spin coating method to a thickness of about 1.0 μm, this was prebaked on a hot plate at 105° C. for 90 seconds, then exposure was performed by a laser beam of a wavelength of 248 nm. After the exposure, heat treatment was immediately performed on a hot plate at 120° C. for 60 seconds, then puddle development was performed by a 0.17N TMAH aqueous solution for 120 seconds. The obtained pattern had a 1:1 resolution of lines and spaces of 0.30 μm by exposure of 45 mJ/cm$^2$. The pattern shape was substantially perpendicular and no residue etc. was observed to appear.

Example 2-2

The resist solution prepared in Reference Example 2-2 was coated on a silicon substrate by the spin coating method to a thickness of about 0.7 μm, this was prebaked on a hot plate at 90° C. for 90 seconds, then exposure was performed by a laser beam of a wavelength of 248 nm. After the exposure, heat treatment was immediately performed on a hot plate at 105° C. for 60 seconds, then dip development was performed by a 0.17N TMAH aqueous solution for 90 seconds. The obtained pattern had a 1:1 resolution of lines and spaces of 0.30 µm by exposure of 50 mJ/cm$^2$. The pattern shape was substantially perpendicular and no residue etc. was observed to appear.

Example 2-3

The resist solution prepared in Reference Example 2-2 was coated on a silicon substrate by the spin coating method to a thickness of about 0.7 µm, this was prebaked on a hot plate at 105° C. for 90 seconds, then exposure was performed by X-rays (SOR). After the exposure, heat treatment was immediately performed on a hot plate at 120° C. for 60 seconds, then dip development was performed by a 0.17N TMAH aqueous solution for 100 seconds. The obtained pattern had a 1:1 resolution of lines and spaces of 0.30 µm, the smallest dimensions of the mask. The pattern shape was substantially perpendicular and no residue etc. was observed to appear.

Comparative Example 2-1

The resist solution prepared in Reference Example 2-1 was coated on a silicon substrate by the spin coating method to a thickness of about 1.0 µm, this was prebaked on a hot plate at 105° C. for 90 seconds, then exposure was performed by a laser beam of a wavelength of 248 nm. After the exposure, heat treatment was immediately performed on a hot plate at 120° C. for 60 seconds, then puddle development was performed by a 0.27N TMAH aqueous solution for 25 seconds. The obtained pattern resolved lines and spaces of 0.30 µm by an exposure of 48 mJ/cm$^2$, but the pattern shape was somewhat reverse tapered and the occurrence of whisker-like residue was observed in patterns of less than 0.35 µm lines and spaces.

Comparative Example 2-2

The resist solution prepared in Reference Example 2-2 was coated on a silicon substrate by the spin coating method to a thickness of about 0.7 µm, this was prebaked on a hot plate at 90° C. for 90 seconds, then exposure was performed by a laser beam of a wavelength of 248 nm. After the exposure, heat treatment was immediately performed on a hot plate at 105° C. for 60 seconds, then puddle development was performed by a 0.27N TMAH aqueous solution for 25 seconds. The obtained pattern resolved lines and spaces of 0.30 µm by an exposure of 52 mJ/cm$^2$, but the pattern shape was somewhat reverse tapered and the occurrence of whisker-like residue was observed in patterns of less than 0.35 µm lines and spaces.

As explained above, according to the second aspect of the present invention, when using a chemical amplification type resist composition including as main components a hydrogenated phenol resin, a melamine resin with an enhanced hexamethoxymethylmelamine content, an acid generator for generating an acid upon irradiation by ionizing radiation, and a solvent to form the resist pattern, by using a 0.1 to 0.25N basic aqueous solution as the developing solution in the development step, it is possible to obtain a pattern superior in resolution and pattern shape without causing whisker-like residue in the pattern.

We claim:

1. A process for forming a chemically amplified resist on a substrate, which comprises:

treating the substrate in a first chamber with a hydrophobic treating agent;

purging the first chamber with an inert gas;

heating the hydrophobic treated substrate in the first chamber;

purging the first chamber with an inert gas;

passing the heated hydrophobic treated substrate to a second chamber separate from the first chamber;

coating the heated hydrophobic treated substrate with a chemically amplified resist in the second chamber; and heating the resist coated substrate in the second chamber.

* * * * *